(12) United States Patent
Classen et al.

(10) Patent No.: US 9,958,348 B2
(45) Date of Patent: *May 1, 2018

(54) MICROMECHANICAL PRESSURE SENSOR DEVICE AND CORRESPONDING MANUFACTURING METHOD

(71) Applicant: Robert Bosch GmbH, Stuttgart (DE)

(72) Inventors: Johannes Classen, Reutlingen (DE); Jochen Reinmuth, Reutlingen (DE); Arnd Kaelberer, Schlierbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/110,261

(22) PCT Filed: Nov. 17, 2014

(86) PCT No.: PCT/EP2014/074752
§ 371 (c)(1),
(2) Date: Jul. 7, 2016

(87) PCT Pub. No.: WO2015/106855
PCT Pub. Date: Jul. 23, 2015

(65) Prior Publication Data
US 2016/0327446 A1    Nov. 10, 2016

(30) Foreign Application Priority Data

Jan. 14, 2014  (DE) .......................... 10 2014 200 512

(51) Int. Cl.
*G01L 9/00*    (2006.01)
*G01L 13/02*   (2006.01)
(Continued)

(52) U.S. Cl.
CPC .......... *G01L 9/0041* (2013.01); *B81B 7/0048* (2013.01); *G01L 9/0073* (2013.01);
(Continued)

(58) Field of Classification Search
CPC ..... G01L 9/0041; G01L 9/008; G01L 9/0073; G01L 9/0084; G01L 13/025; G01L 7/00;
(Continued)

(56) References Cited

U.S. PATENT DOCUMENTS 7,250,353 B2 *  7/2007  Nasiri ................. B81C 1/00333
                                                      257/499
7,442,570 B2 * 10/2008  Nasiri ................. B81C 1/00238
                                                      438/118
(Continued)

FOREIGN PATENT DOCUMENTS

CN   102180435    9/2011
DE   102006011545 9/2007
(Continued)

*Primary Examiner* — Manish S Shah
*Assistant Examiner* — Nigel Plumb
(74) *Attorney, Agent, or Firm* — Norton Rose Fulbright US LLP; Gerard Messina

(57) ABSTRACT

A micromechanical pressure sensor device and a corresponding manufacturing method. The micromechanical pressure sensor device includes an ASIC wafer having a front side and a rear side, and a rewiring system, formed on the front side of the ASIC wafer, which includes a plurality of stacked strip conductor levels and insulation layers. The pressure sensor device also includes a MEMS wafer having a front side and a rear side, a first micromechanical functional layer which is formed above the front side of the MEMS wafer, and a second micromechanical functional layer which is formed above the first micromechanical functional layer.

11 Claims, 10 Drawing Sheets

(51) Int. Cl.
  *G01L 19/06* (2006.01)
  *B81B 7/00* (2006.01)

(52) U.S. Cl.
  CPC ........ *G01L 13/026* (2013.01); *G01L 19/0636* (2013.01); *B81B 2201/0235* (2013.01); *B81B 2201/0242* (2013.01); *B81B 2201/0264* (2013.01); *B81B 2207/012* (2013.01)

(58) Field of Classification Search
  CPC .......... B61B 7/0048; B81B 2201/0235; B81B 2201/0242; B81B 2201/0264
  USPC .................. 73/723, 717, 716, 715, 700, 753
  See application file for complete search history.

(56) References Cited

U.S. PATENT DOCUMENTS

| | | | | |
|---|---|---|---|---|
| 9,709,451 | B2* | 7/2017 | Kaelberer | G01L 9/0072 |
| 2010/0171153 | A1* | 7/2010 | Yang | B81C 1/00246 |
| | | | | 257/254 |
| 2011/0154905 | A1* | 6/2011 | Hsu | G01L 9/0073 |
| | | | | 73/724 |
| 2011/0303993 | A1* | 12/2011 | Yamamoto | G01L 1/18 |
| | | | | 257/415 |
| 2012/0043627 | A1* | 2/2012 | Lin | B81B 7/02 |
| | | | | 257/415 |
| 2012/0049299 | A1* | 3/2012 | Chou | B81C 1/00246 |
| | | | | 257/417 |
| 2012/0235251 | A1* | 9/2012 | Daneman | A45D 27/42 |
| | | | | 257/415 |
| 2013/0001550 | A1* | 1/2013 | Seeger | G01L 5/223 |
| | | | | 257/48 |
| 2013/0001710 | A1* | 1/2013 | Daneman | H01L 23/10 |
| | | | | 257/415 |
| 2016/0341616 | A1* | 11/2016 | Classen | G01L 9/0042 |

FOREIGN PATENT DOCUMENTS

| | | |
|---|---|---|
| DE | 102007008518 | 8/2008 |
| DE | 102007057492 | 6/2009 |
| DE | 102010006132 | 8/2011 |
| DE | 102010039057 | 2/2012 |
| DE | 102012215235 | 5/2013 |
| DE | 102013213071 | 10/2014 |
| EP | 1927575 | 6/2008 |
| WO | 2012040211 | 3/2012 |

* cited by examiner

MICROMECHANICAL PRESSURE SENSOR DEVICE AND CORRESPONDING MANUFACTURING METHOD

FIELD

The present invention relates to a micromechanical pressure sensor device and a corresponding manufacturing method.

BACKGROUND INFORMATION

A micromechanical pressure sensor device is described in German Patent Application No. DE 10 2013 213 071 B3 which has an ASIC wafer (1a) having a front side and a rear side, a rewiring device having a plurality of stacked strip conductor levels and insulation layers, a MEMS wafer having a front side and a rear side, a first micromechanical functional layer formed above the front side of the MEMS wafer, a second micromechanical functional layer formed above the first micromechanical functional layer, a diaphragm area being developed in one of the first and second micromechanical layers as a deflectable first pressure detection electrode, on which pressure is applicable through a via in the MEMS wafer, a stationary second pressure detection electrode being developed at a distance and opposite from the diaphragm area in the other of the first and second micromechanical functional layer, the second micromechanical layer being connected via a bond connection to the rewiring device in such a way that the stationary second pressure detection electrode is enclosed in a cavity, the diaphragm area being formed in first micromechanical functional layer (3) and the stationary second pressure detection electrode being formed in the second micromechanical functional layer, and the stationary second pressure detection electrode having an anchoring area, which is anchored on the first micromechanical functional layer.

A similar micromechanical pressure sensor device is described in U.S. Patent Application Publication No. 2012/0043627 A1, a cap substrate being used instead of the ASIC wafer for capping.

Although any micromechanical components are applicable, the present invention and its underlying object to be achieved are explained with reference to components based on silicon.

Micromechanical sensor devices for measuring acceleration, rotation rate, magnetic field, and pressure, for example, are generally available, and are mass-produced for various applications in the automotive and consumer sectors. In particular the miniaturization of components, functional integration, and effective cost reduction are trends in consumer electronics.

Nowadays, acceleration sensors and rotation rate sensors, as well as acceleration sensors and magnetic field sensors, are already manufactured as combination sensors (6d), and in addition there are first 9d modules, in which in each case 3-axis acceleration sensors, rotation rate sensors, and magnetic field sensors are combined into a single sensor device.

In contrast, pressure sensors nowadays are developed and manufactured separately from the above-mentioned 6d and 9d modules. An important reason for this is the necessary media access which a pressure sensor requires, as opposed to inertial sensors and magnetic sensors, which greatly increases the effort and the costs for packaging the pressure sensor. Other reasons for the separation of pressure sensors are the different MEMS manufacturing processes and the different evaluation processes.

For example, pressure sensors often make use of piezoresistive resistors for the evaluation, whereas inertial sensors are preferably evaluated capacitively.

However, sensor devices which are able to measure the pressure in addition to inertial variables may represent an interesting expansion of the options for functional integration, in particular in the area of consumer electronics. Such integrated 7d modules, or, for integration of a 3-axis magnetic sensor, 10d modules, could be used for navigation applications (indoor navigation), for example. The functional integration is promising for achieving cost reductions as well as reduced space requirements on the application circuit board.

Methods of so-called vertical integration, hybrid integration, or 3D integration are described, for example, in U.S. Pat. Nos. 7,250,353 B2 and 7,442,570 B2, in which at least one MEMS wafer and one evaluation ASIC wafer are mechanically and electrically connected to one another by way of wafer bonding processes. These vertical integration methods are particularly attractive in combination with silicon vias and flip chip technologies, as a result of which the external contacting may take place as a bare die module or a chip scale package, and thus without plastic outer packaging, as described in U.S. Patent Application Publication Nos. 2012/0049299 A1 and US 2012/0235251 A1, for example.

U.S. Patent Application Publication No. 2013/0001710 A1 describes a method and a system for forming a MEMS sensor device, in which a handling wafer is bonded to a MEMS wafer by way of a dielectric layer. After structuring the MEMS wafer to form the micromechanical sensor device, a CMOS wafer is bonded to the MEMS wafer, which includes the sensor device. At the end of the process, the handling wafer may be further processed by etching or back-grinding, if necessary.

SUMMARY

The present invention provides a micromechanical pressure sensor device and a corresponding manufacturing method. Preferred refinements are described below.

In accordance with the present invention, a MEMS system is provided which includes a micromechanical pressure sensor device having two pressure detection electrodes integrated therein, and which is capped by an ASIC system.

Since both pressure detection electrodes are formed in the MEMS system, the design according to the present invention provides greatly improved stress decoupling compared to conventional approaches. The mounting stress coupled into the ASIC system may be coupled into the MEMS system only by way of the bond connection. Since the bond connection and the electrical contacts may be well separated from the diaphragm area, any bending effects are greatly reduced. This results in improved performance with regard to important base parameters such as sensitivity and offset of the pressure sensor device. Soldering stress and temperature effects are reduced considerably, and stability over the service life is improved.

According to the present invention, the diaphragm area is formed in the first micromechanical functional layer, and the stationary second pressure detection electrode is formed in the second micromechanical functional layer. This type of configuration may be easily and cost-effectively implemented.

According to the present invention, the stationary second pressure detection electrode includes at least one anchoring area which is anchored on the first micromechanical functional layer, the second micromechanical functional layer having a contact area separated from the anchoring area, which on the one hand is anchored on the first micromechanical functional layer and which on the other hand has an electrical connection to an uppermost strip conductor level by way of an area of the bond connection, and the anchoring area and the contact area being electrically connected by way of the first micromechanical functional layer. This type of configuration further reduces the stress coupling, since the anchoring area is not connected to the rewiring system of the ASIC system.

According to a preferred refinement, a spring element is provided between the at least one anchoring area and the remaining portion of the stationary second pressure detection electrode. This also improves the stress decoupling.

According to another preferred refinement, a ring-shaped anchoring area is provided. This type of anchoring is particularly robust.

According to another aspect of the present invention, the diaphragm area in the second micromechanical functional layer and the stationary second pressure detection electrode in the first micromechanical functional layer have a perforated design, the diaphragm area being anchored on the first micromechanical functional layer with a ring-shaped closure. A thick, stable diaphragm area may be achieved in this way.

According to another preferred refinement, a stationary third pressure detection electrode is formed in the uppermost strip conductor level, at a distance and opposite from the diaphragm area. The pressure signal may be differentially evaluated in this way.

According to another preferred refinement, a reference diaphragm area is formed in the first micromechanical functional layer, and a stationary reference electrode is formed in the second micromechanical functional layer, at a distance and opposite from the reference diaphragm area, whereby the reference diaphragm area cannot be acted on by the pressure. Drift effects due to stress coupling may be differentially reduced in this way.

According to another preferred refinement, a further diaphragm area is formed in the first micromechanical functional layer, and a stationary reference electrode is formed in the second micromechanical functional layer, at a distance and opposite from the further diaphragm area, the further diaphragm area being designed as a deflectable moisture detection electrode which is covered with a moisture-sensitive layer which may be acted on by moisture through a further via in the MEMS wafer. A combination of a pressure sensor and a moisture sensor may thus be implemented in diaphragm technology.

According to another preferred refinement, a further sensor device is formed in the second micromechanical functional layer, and the bond connection includes an area that is connected to the rewiring system in such a way that the further sensor device is enclosed in a further cavity which is hermetically separated from the cavity. It is thus possible to take into account the fact that different types of sensors require different working environments.

According to another preferred refinement, the diaphragm area may be acted on by counterpressure through a further via in the MEMS wafer which leads into the cavity. A differential pressure sensor may be implemented in this way.

BRIEF DESCRIPTION OF THE DRAWINGS

Further features and advantages of the present invention are explained below based on specific embodiments, with reference to the figures.

DETAILED DESCRIPTION OF EXAMPLE EMBODIMENTS

Figure 1:
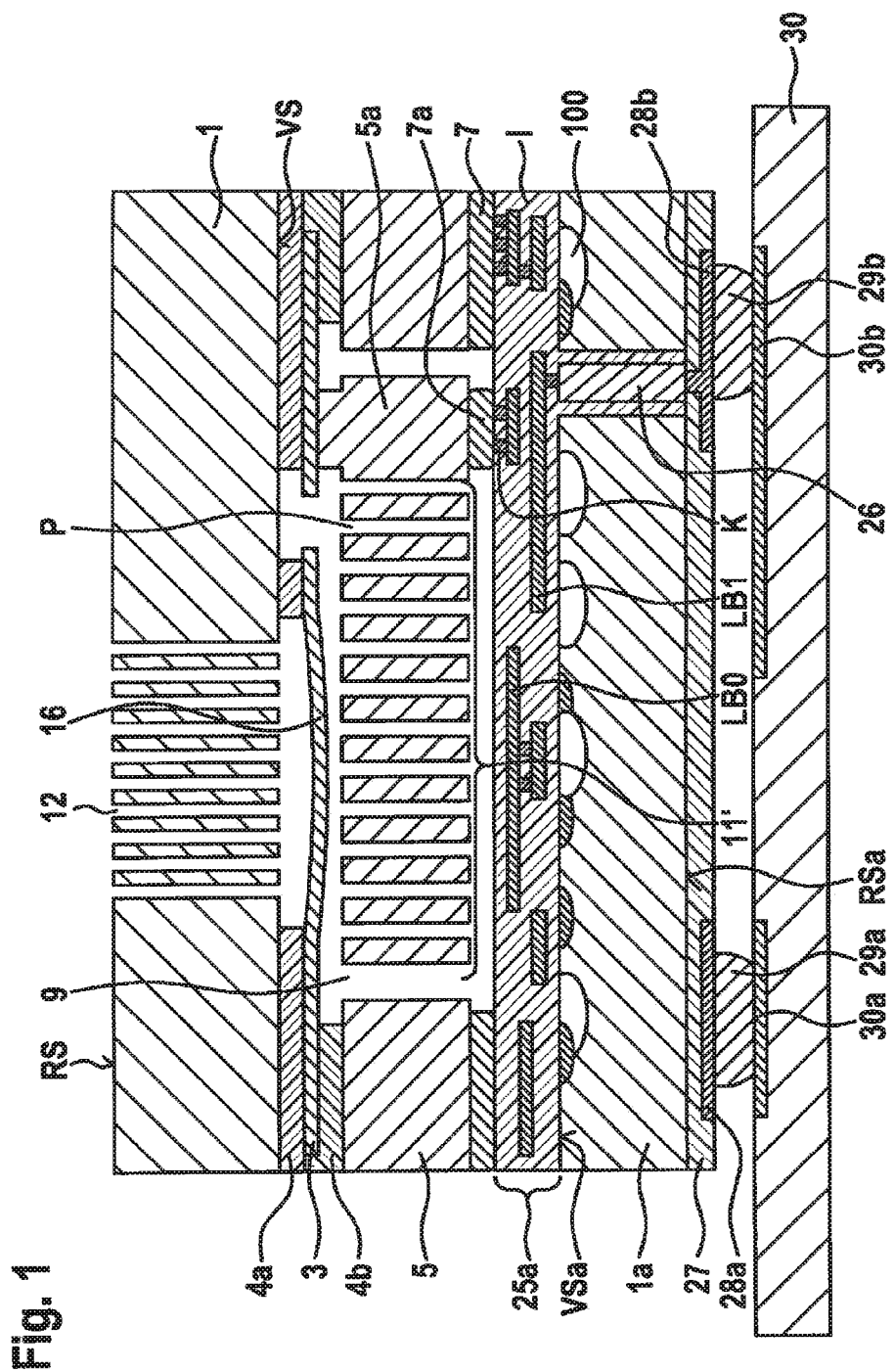
FIG. 1 shows a schematic cross-sectional view for explaining an exemplary micromechanical pressure sensor device and a corresponding manufacturing method.

Identical or functionally equivalent elements are denoted by the same reference numerals in the figures.

FIG. 1 is a schematic cross-sectional view for explaining an exemplary micromechanical pressure sensor device and a corresponding manufacturing method.

In FIG. 1, reference numeral 1 denotes an ASIC wafer which includes a plurality of CMOS circuits 100 which include, for example, an evaluation circuit for the micromechanical pressure sensor device to be formed.

ASIC wafer 1a has a front side VSa and a rear side RSa. On front side VS of ASIC wafer 1, a rewiring system 25a is formed which includes a plurality of strip conductor levels LB0, LB1 and insulating layers I situated in between. To simplify the illustration, insulating layers I in which strip conductor levels LB0, LB1 are embedded are not separately illustrated. The strip conductor sections of strip conductor levels LB0, LB1 are electrically connected to one another by electrically conductive vias K.

In addition, reference numeral 1 denotes a MEMS wafer having a front side VS and a rear side RS. A first insulating layer 4a, for example an oxide layer, is applied on front side VS. A first micromechanical functional layer 3 made of polysilicon, for example, is provided on first insulating layer 4a, and includes a diaphragm area 16 which is designed as a deflectable first pressure detection electrode which may be acted on by pressure through a via 12, which in this specific embodiment is a trench grid, in MEMS wafer 1. Diaphragm area 16 is thus anchored on first insulating layer 4a.

This type of trench grid, as a via, typically has a honeycomb structure with webs which extend in both normal directions perpendicular to the wafer. On the one hand, due to the open areas of the trench grid structure, the oxide etching process for etching first insulating layer 4a may attack a large surface area, and on the other hand the open areas of the trench grid structure subsequently represent the media access for the pressure sensor device. The trench grid is used for protecting diaphragm area 16 from fairly large particles, for example, which may arise during the sawing process for separating the components, and which do not fit through the small open areas. Preferred geometries for the trench grid structure are web widths of 5 µm to 50 µm and hole sizes of 5 µm to 50 µm; the web widths and the hole sizes do not necessarily have to be the same.

On first micromechanical functional layer 3 outside diaphragm area 16, a second insulating layer 4b is provided, likewise an oxide layer, for example, which, the same as first insulating layer 4a, is structured according to the functionality to be achieved.

A second micromechanical functional layer 5, likewise polysilicon, for example, is situated on second insulating layer 4b. A stationary second pressure detection electrode 11' is formed in second micromechanical functional layer 5, at a distance and opposite from diaphragm area 16. Stationary second pressure detection electrode 11' in second micromechanical functional layer 5 has perforations P, since it is to be exposed by way of a sacrificial layer etching process in which second insulating layer 4b is partially removed.

In addition, stationary second pressure detection electrode 11' includes an anchoring area 5a in second micromechanical functional layer 5, by way of which it is anchored on first micromechanical functional layer 3.

The MEMS system designed in this way, including MEMS wafer 1, insulating layers 4a, 4b, and first and second micromechanical functional layers 3, 5, is connected by way of a bond connection 7 to the ASIC system, which includes ASIC wafer 1a and rewiring system 25a, in such a way that bond connection 7 connects a portion of second micromechanical functional layer 5 to rewiring system 25a. An area 7a of bond connection 7 is used here for establishing an electrical connection, through vias K, between stationary second pressure detection electrode 11' and uppermost strip conductor level LB0 of rewiring system 25a.

Bond connection 7 is preferably achieved by a metallic bonding process, for example eutectic bonding of aluminum and germanium, copper, and tin, or metallic thermocompression bonding (Au—Au, Cu—Cu, . . . ). Further electrical contacts may be provided by way of bond connection 7, as indicated, for example, in the right edge area in FIG. 1.

In the first specific embodiment according to FIG. 1, diaphragm area 16, as a deflectable first pressure detection electrode, as well as stationary second pressure detection electrode 11' are provided in the MEMS system, and are therefore decoupled relatively well from possible mechanical bendings of the ASIC system.

In addition to the electrical connection function, the ASIC system also fulfills, for example, an evaluation function, as well as the function of capping for closing cavity 9.

The electrical connection of the pressure sensor device having such a design to a carrier substrate 30 takes place, for example, by electrical vias 26 which extend through ASIC wafer 1a, only one of which is shown in FIG. 1 for reasons of simplicity. Situated on rear side RSa of ASIC wafer 1a is a third insulating layer 27, for example an oxide layer, nitride layer, or polyimide layer, which contains embedded or mounted strip conductor sections 28a, 28b, of which strip conductor section 28b is electrically connected to via 26.

Bonding balls 29a and 29b, for example solder balls, are provided on strip conductor sections 28a, 28b, with the aid of which an electrical connection to strip conductor sections 30a, 30b in or on carrier substrate 30 is established.

Figure 2:
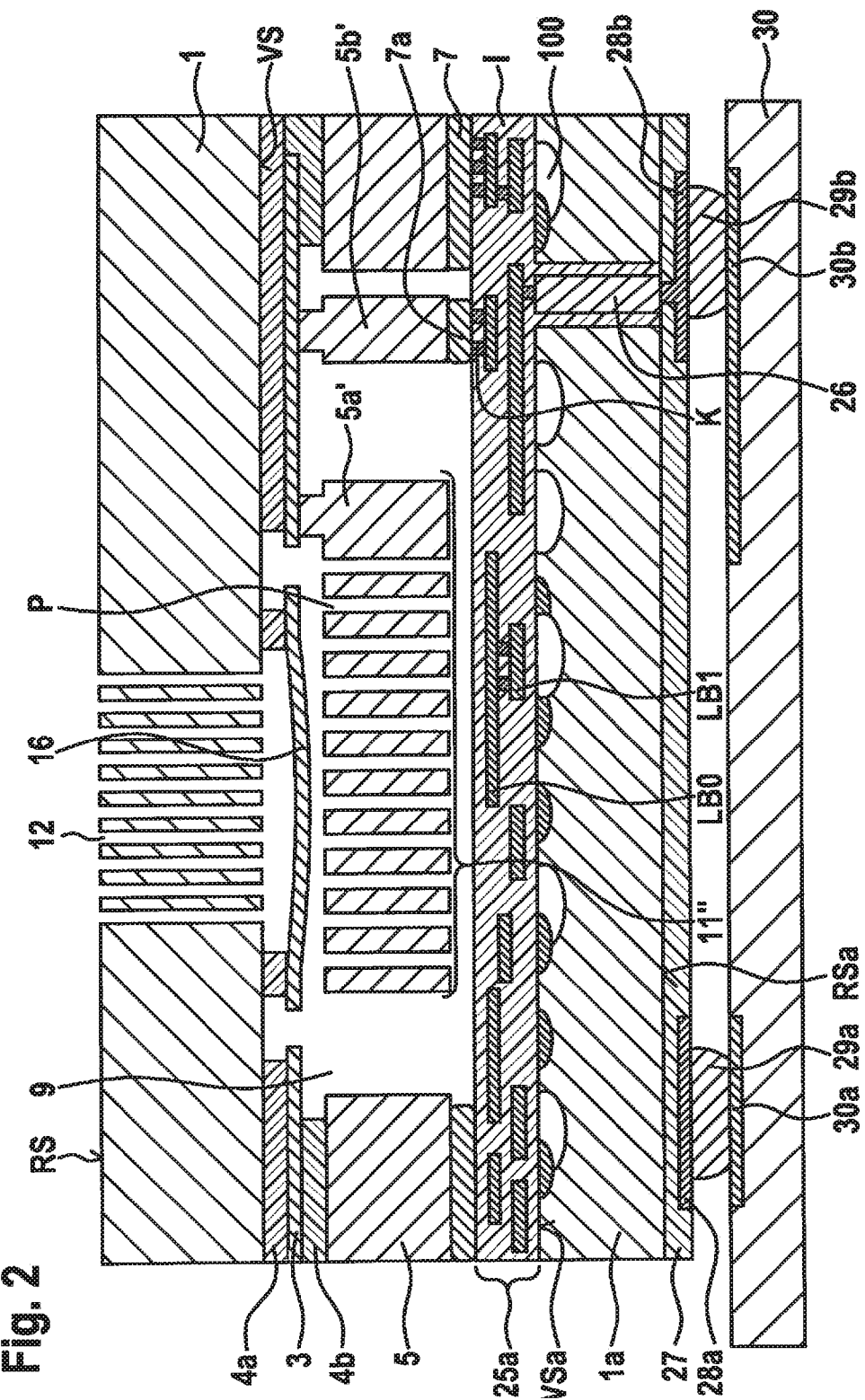
FIG. 2 shows a schematic cross-sectional view for explaining a micromechanical pressure sensor device and a corresponding manufacturing method according to a first specific embodiment of the present invention.

FIG. 2 shows a schematic cross-sectional view for explaining a micromechanical pressure sensor device and a corresponding manufacturing method according to a first specific embodiment of the present invention.

In the first specific embodiment according to FIG. 2, the anchoring and the electrical contacting of the second pressure detection electrode, denoted by reference numeral 11", in second micromechanical functional layer 5 are separate. For this purpose, stationary second pressure detection electrode 11" includes an anchoring area 5a' which is anchored only on first micromechanical functional layer 3.

In addition, second micromechanical functional layer 5 includes a contact area 5b' which on the one hand is anchored on first micromechanical functional layer 3, and on the other hand has an electrical connection to uppermost strip conductor level LB0 of rewiring system 25a by way of area 7a of bond connection 7.

Anchoring area 5a' and contact area 5b' are electrically connected to one another by way of first micromechanical functional layer 3. The stress transmitted from the ASIC system into the MEMS system by way of area 7a thus results in even more greatly reduced bending of stationary second pressure detection electrode 11" in comparison to the first specific embodiment.

Figure 3:
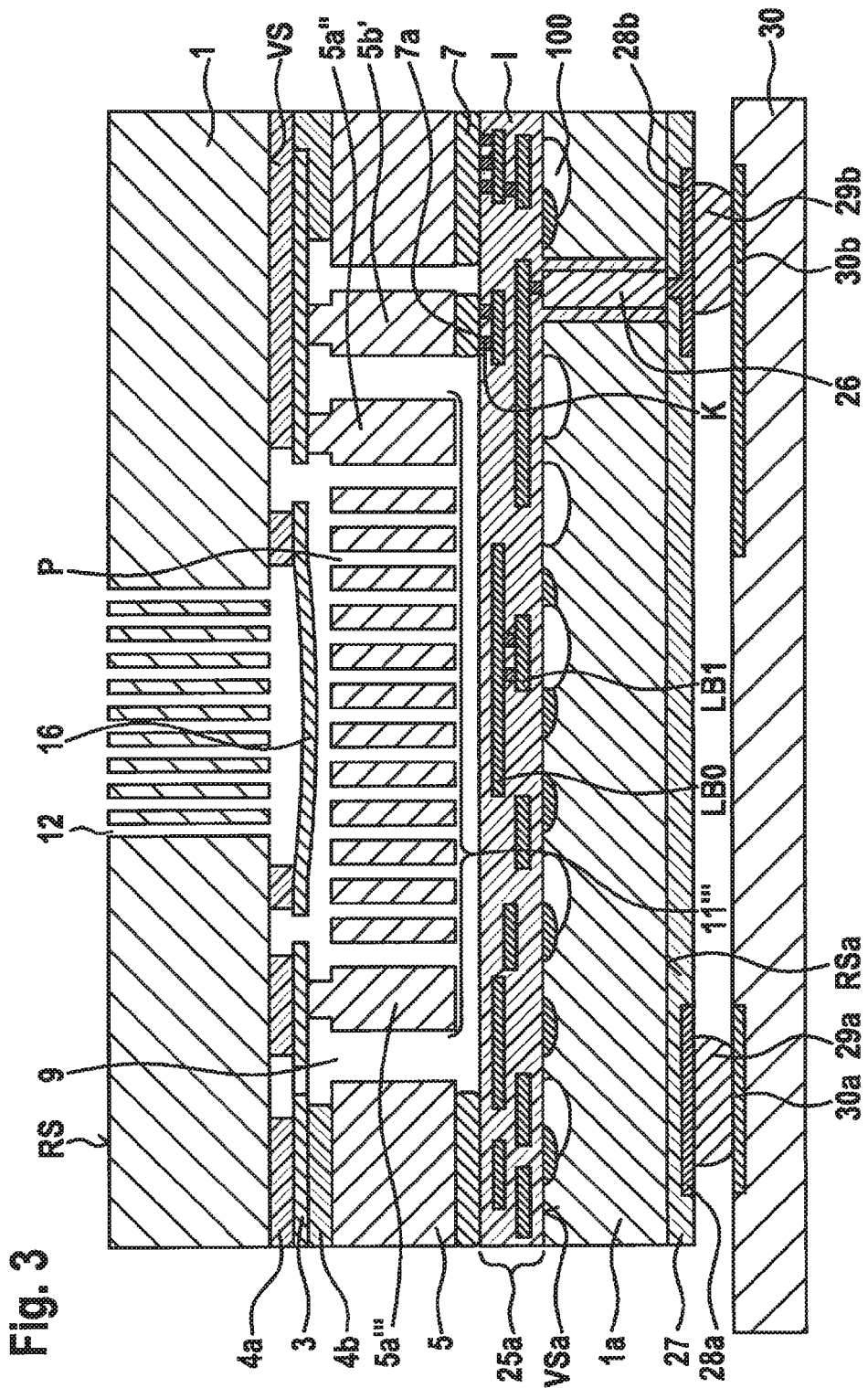
FIG. 3 shows a schematic cross-sectional view for explaining a micromechanical pressure sensor device and a corresponding manufacturing method according to a second specific embodiment of the present invention.

FIG. 3 shows a schematic cross-sectional view for explaining a micromechanical pressure sensor device and a corresponding manufacturing method according to a second specific embodiment of the present invention.

In the second specific embodiment shown in FIG. 3, the stationary second pressure detection electrode is denoted by reference numeral 11'''. Stationary pressure detection electrode 11''' is connected to first micromechanical functional layer 3 at multiple anchoring areas 5a", 5a'''. This type of configuration even further reduces possible bending of stationary pressure detection electrode 11''', and improves the mechanical robustness under high mechanical overload. Of course, any desired number of anchoring areas 5a", 5a''' may be provided, for example also a ring-shaped circumferential anchoring area.

Figure 4:
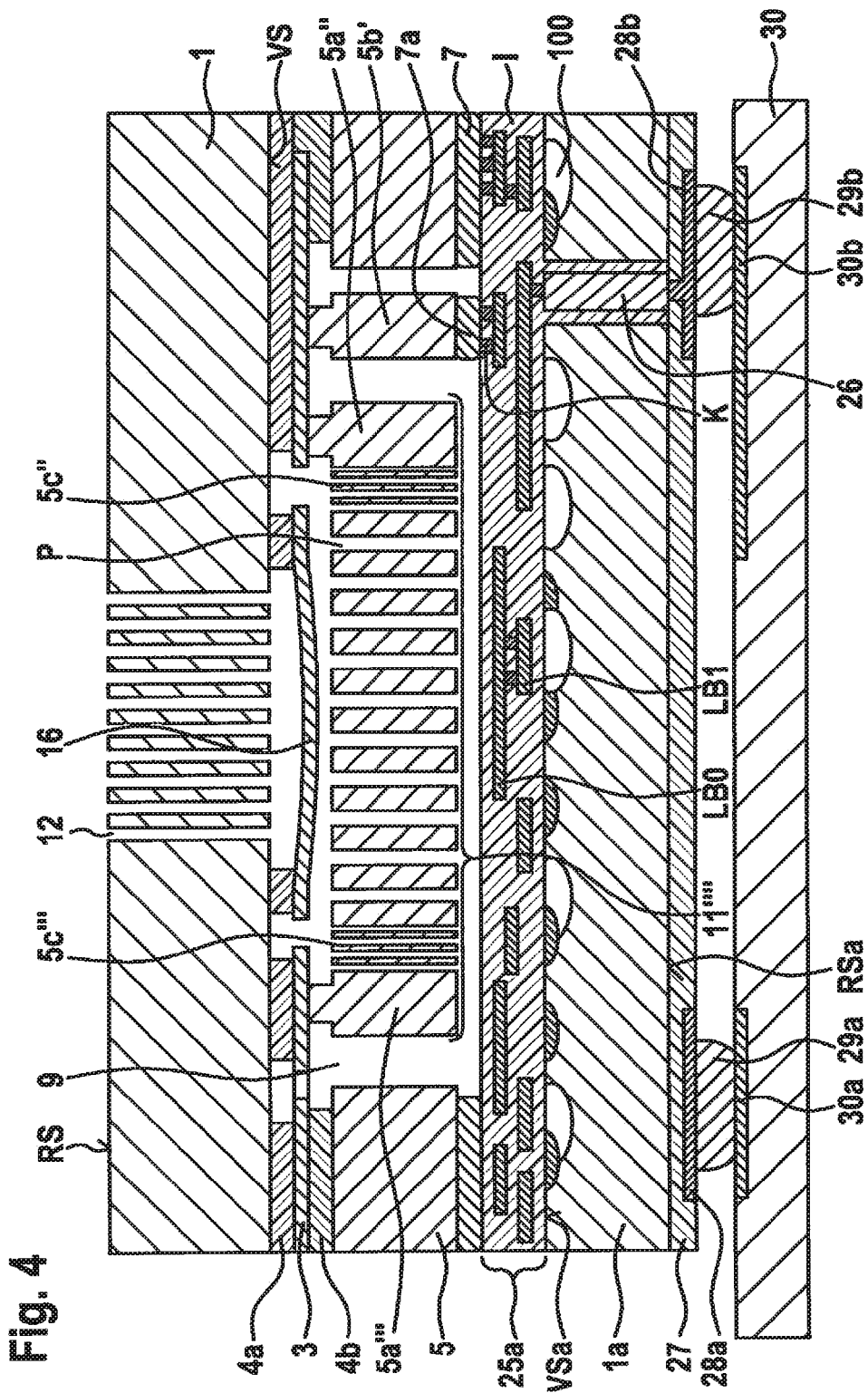
FIG. 4 shows a schematic cross-sectional view for explaining a micromechanical pressure sensor device and a corresponding manufacturing method according to a third specific embodiment of the present invention.

FIG. 4 shows a schematic cross-sectional view for explaining a micromechanical pressure sensor device and a corresponding manufacturing method according to a third specific embodiment of the present invention.

In the third specific embodiment according to FIG. 4, in contrast to the second specific embodiment, spring elements 5c", 5c''' are provided which connect anchoring areas 5a" and 5a''', respectively, to the remaining portion of stationary second pressure detection electrode 11''''.

Figure 5:
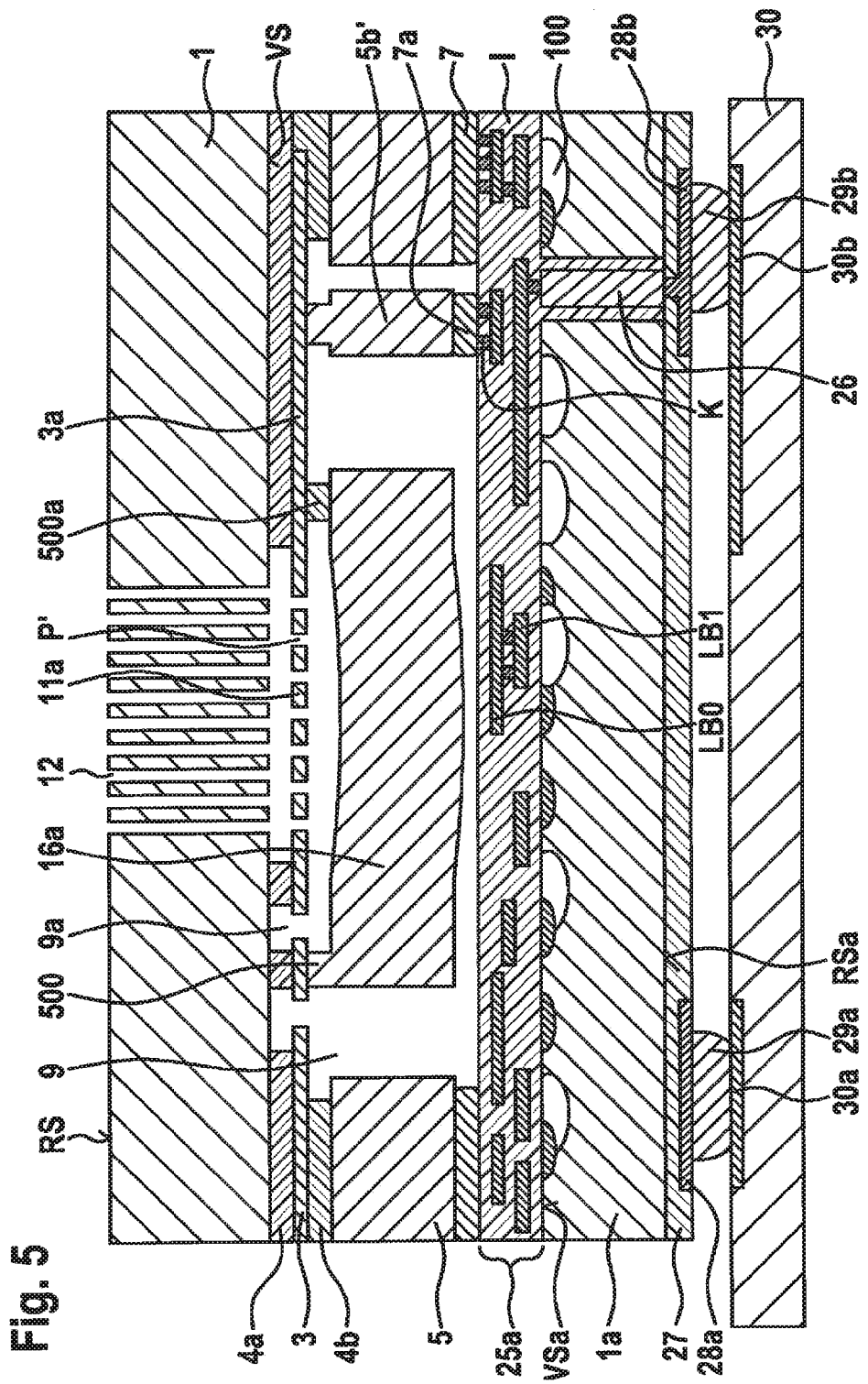
FIG. 5 shows a schematic cross-sectional view for explaining a micromechanical pressure sensor device and a corresponding manufacturing method according to a fourth specific embodiment of the present invention.

FIG. 5 shows a schematic cross-sectional view for explaining a micromechanical pressure sensor device and a corresponding manufacturing method according to a fourth specific embodiment of the present invention.

In the fourth specific embodiment according to FIG. 5, diaphragm area 16a, which may be acted on by pressure, is structured as a first pressure detection electrode in second micromechanical functional layer 5, and stationary second pressure detection electrode 11a is structured in first micromechanical functional layer 3.

Stationary second pressure detection electrode 11a has perforations P' to allow pressure access from via 12 in MEMS wafer 1 to diaphragm area 16a. In addition, perforations P' are necessary for removing the two insulating layers 4a, 4b between diaphragm area 16a and stationary pressure detection electrode 11a, and thus establishing functional efficiency. This oxide etching process takes place from rear side RS of MEMS wafer 1, preferably with gaseous HF.

Anchoring 500, 500a of diaphragm area 16a has a ring-shaped design to ensure the hermeticity with respect to via 12. Anchoring 500, 500a includes at least one insulating anchoring area 500a which is advantageously formed by an oxide in order to conduct the electrical supply inwardly to stationary pressure detection electrode 11a by way of strip conductor area 3a of first micromechanical functional layer 3. Of course, this electrically insulating anchoring area 500a as well has to be closed hermetically tight.

Figure 6:
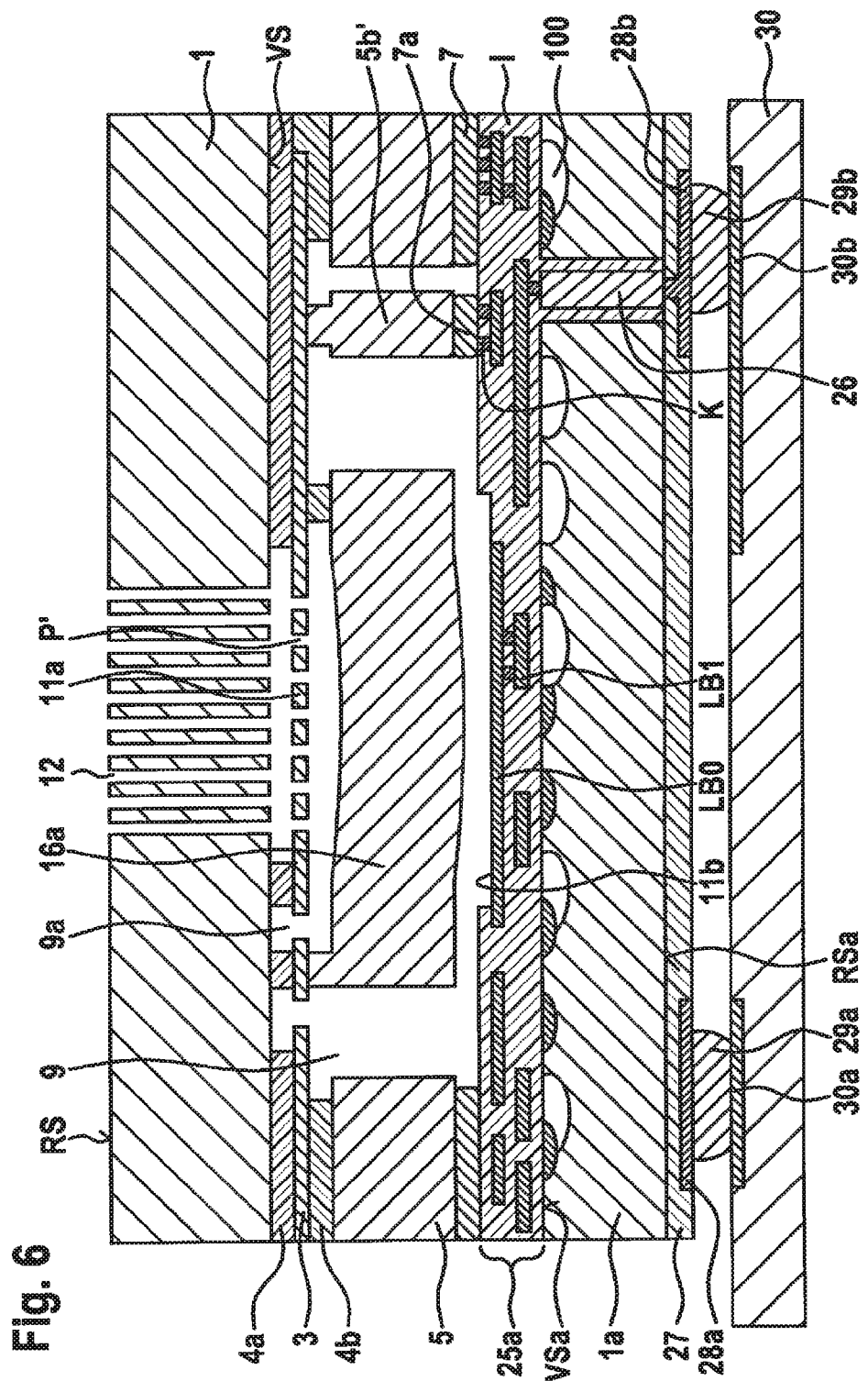
FIG. 6 shows a schematic cross-sectional view for explaining a micromechanical pressure sensor device and a corresponding manufacturing method according to a fifth specific embodiment of the present invention.

FIG. 6 shows a schematic cross-sectional view for explaining a micromechanical pressure sensor device and a corresponding manufacturing method according to a fifth specific embodiment of the present invention.

In the fifth specific embodiment according to FIG. 6, in comparison to the fourth specific embodiment, a stationary third pressure detection electrode 11b is additionally provided in uppermost strip conductor level LB0 of rewiring system 25a.

This is a fully differential electrode system in which a difference signal between the two stationary pressure detection electrodes 11a, 11b may be directly read out. This is particularly advantageous for the evaluation circuit, since differential amplifiers are preferably used in the input stage for capacitive evaluation circuits having stringent signal-to-noise requirements. In addition, the evaluation signal is approximately twice as high as for a one-sided electrode system, which results in an improved signal-to-noise ratio anyway. Depending on the coupled bending, this system may also be advantageous with regard to stress influences.

Figure 7:
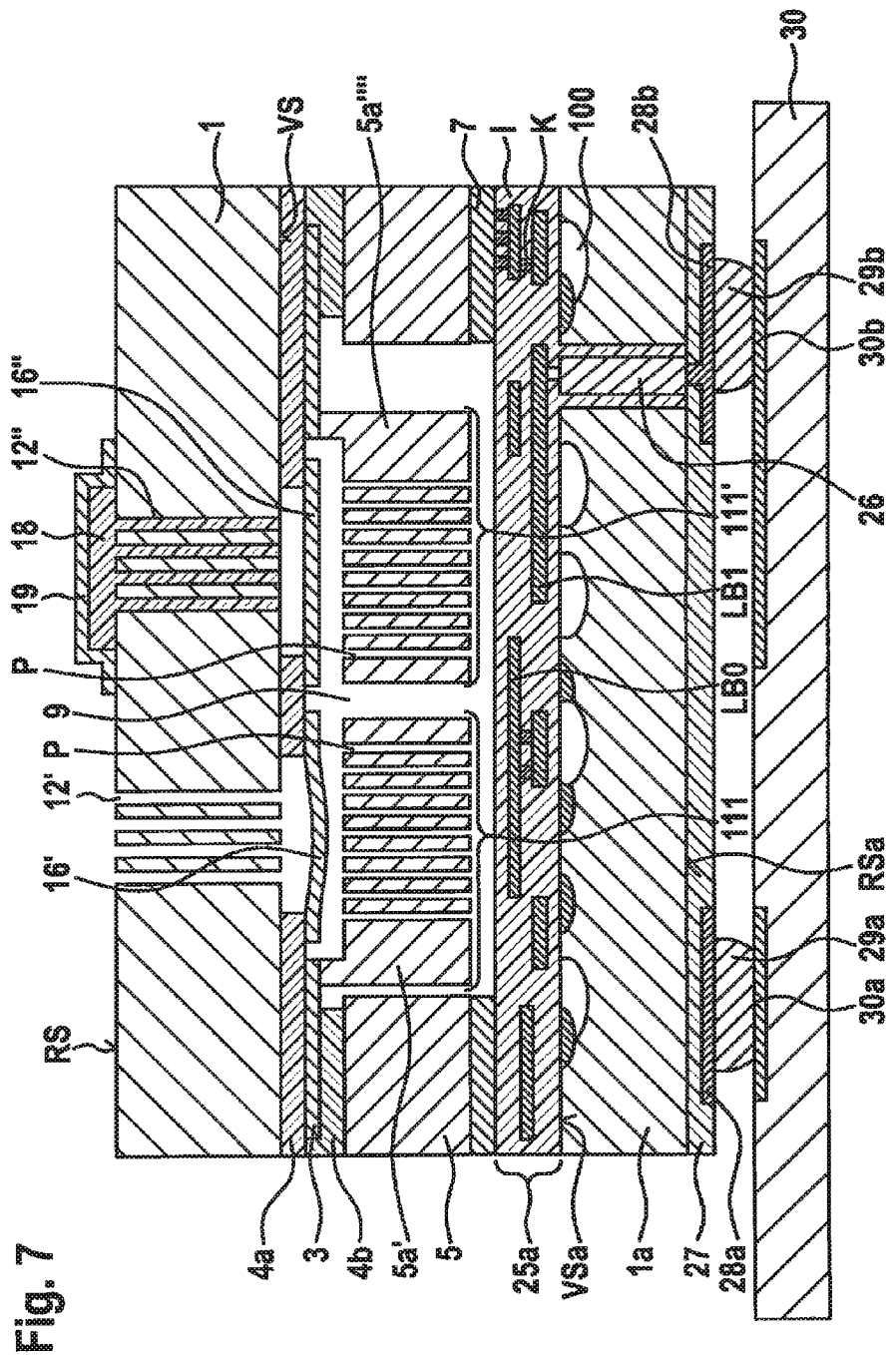
FIG. 7 shows a schematic cross-sectional view for explaining a micromechanical pressure sensor device and a corresponding manufacturing method according to a sixth specific embodiment of the present invention.

FIG. 7 shows a schematic cross-sectional view for explaining a micromechanical pressure sensor device and a corresponding manufacturing method according to a sixth specific embodiment of the present invention.

In the sixth specific embodiment, reference numeral 16' denotes the diaphragm area as a deflectable first pressure detection electrode, which may be acted on by pressure through via 12' in MEMS wafer 1. Stationary second pressure detection electrode 111 is anchored on first micromechanical functional layer 3 by way of anchoring area 5a'.

A reference diaphragm area 16" is formed in first micromechanical functional layer 3, a stationary reference electrode 111' being formed in second micromechanical functional layer 5, at a distance and opposite from the reference diaphragm area 16", and being anchored in first micromechanical functional layer 3 by way of anchoring area 5a''''.

Reference diaphragm area 16" cannot be acted on by pressure, and instead is used for compensating for drift effects of the micromechanical pressure sensor device. This function may be reliably implemented in particular when diaphragm areas 16', 16" are of the same type and are symmetrically situated with respect to the main axes of MEMS wafer 1.

During the manufacture, in order to expose reference diaphragm area 16", an appropriate access opening 12", likewise illustrated as a trench grid here, must initially be provided in MEMS wafer 1. After reference diaphragm area 16" has been exposed, this access opening 12" is closed, for example with the aid of an oxide filling 18 and a metal layer 19 optionally deposited thereon on rear side RS. For even more reliable functioning of the oxide closure with oxide layer 18, the trench through MEMS wafer 1, at least in the area of access opening 12" to be closed, is created by an oxide grid structure. It is thus possible to provide relatively wide trenches, and subsequently, by depositing a thin oxide layer 18, to still hermetically close the trenches and minimize the topography on rear side RS of MEMS wafer 1.

Drift effects, for example packaging stress, should act similarly on both diaphragm areas 16', 16", and deliver a rectified signal. In contrast, pressure changes result in warping only at diaphragm area 16', which is acted on by pressure. By evaluating the difference signal of the two diaphragm areas 16', 16", the rectified signals caused by packaging stress may be eliminated, and only the desired pressure sensor signal remains as a measured variable.

Such a differential evaluation of capacitance signals is advantageous, since most front-end evaluation circuits for acceleration sensors likewise carry out a differential evaluation of two capacitances, one of which becomes larger, and the other smaller, during an acceleration. Acceleration sensor front ends which are present or only slightly modified may thus also be advantageously used for evaluating pressure sensor signals, thus reducing the development effort.

Figure 8:
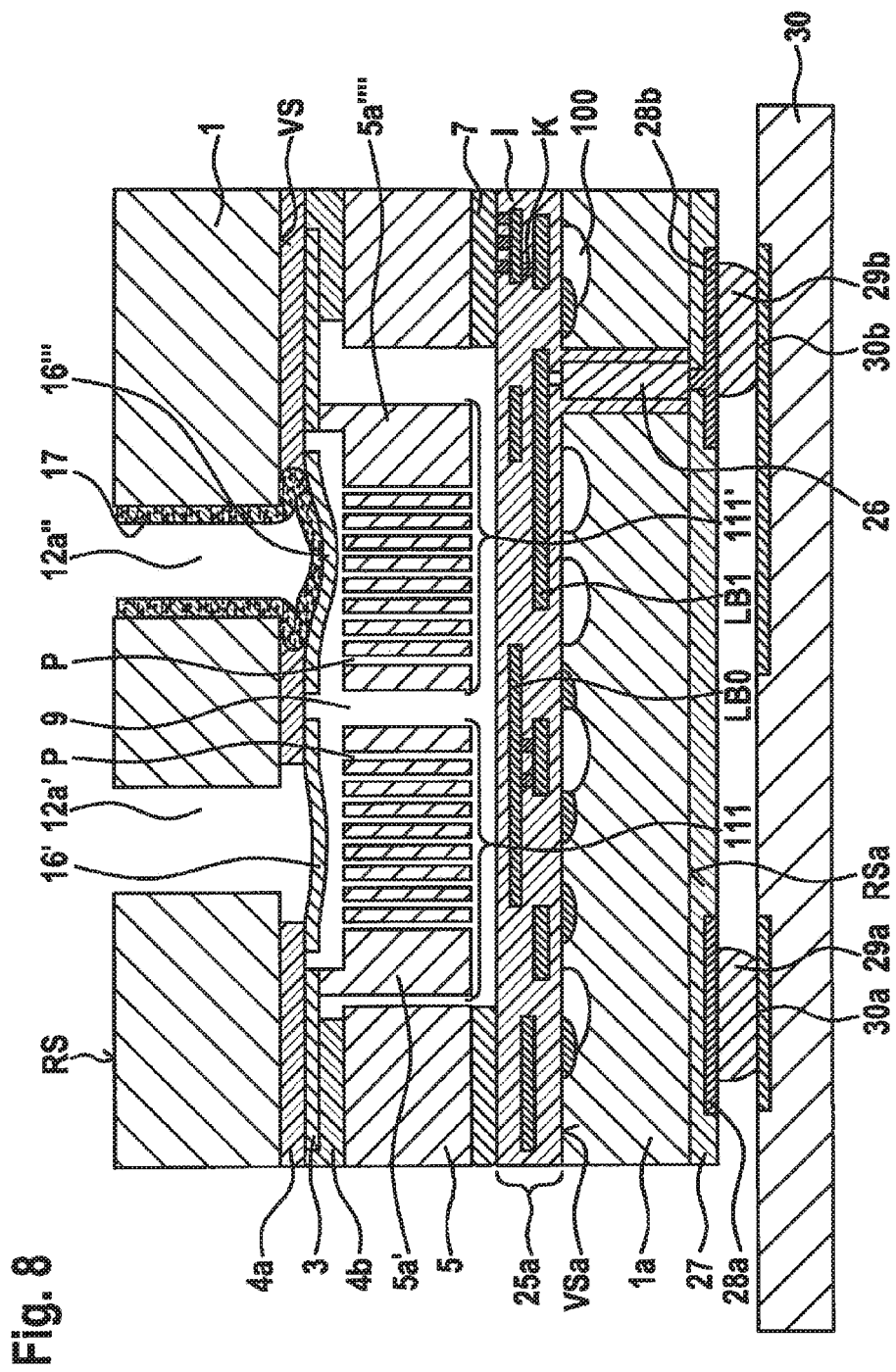
FIG. 8 shows a schematic cross-sectional view for explaining a micromechanical pressure sensor device and a corresponding manufacturing method according to a seventh specific embodiment of the present invention.

FIG. 8 shows a schematic cross-sectional view for explaining a micromechanical pressure sensor device and a corresponding manufacturing method according to an seventh second specific embodiment of the present invention.

In the seventh specific embodiment, the micromechanical pressure sensor device is combined with a micromechanical moisture sensor device.

Similarly to the embodiment described above, diaphragm area 16', already described, and a further diaphragm area 16''' are formed in first micromechanical functional layer 3. In this specific embodiment, pressure access opening 12a' is an individual opening, not a trench grid. A further via 12a" is used for exposing further diaphragm area 16''', situated at a distance and opposite from stationary reference electrode 111' in second micromechanical functional layer 5.

After diaphragm areas 16', 16''' are exposed, a moisture-sensitive layer 17 which covers the interior of via 12a" and further diaphragm area 16''' is deposited and back-etched in via 12a". When the ambient moisture changes, moisture-sensitive layer 17 absorbs or releases additional water molecules. As a result, the mechanical stress on moisture-sensitive layer 17 changes, and this change is transmitted to further diaphragm area 16''' and may in turn be capacitively evaluated. In this case, the aggregate signal of the two diaphragm areas 16', 16", or also the signal of first diaphragm area 16' alone, provides the pressure information, whereas the difference signal provides the moisture information. Effects due to packaging stress should in turn approximately cancel each other out, at least in the difference signal, with a sufficiently symmetrical configuration and similar design of diaphragm areas 16', 16".

Figure 9:
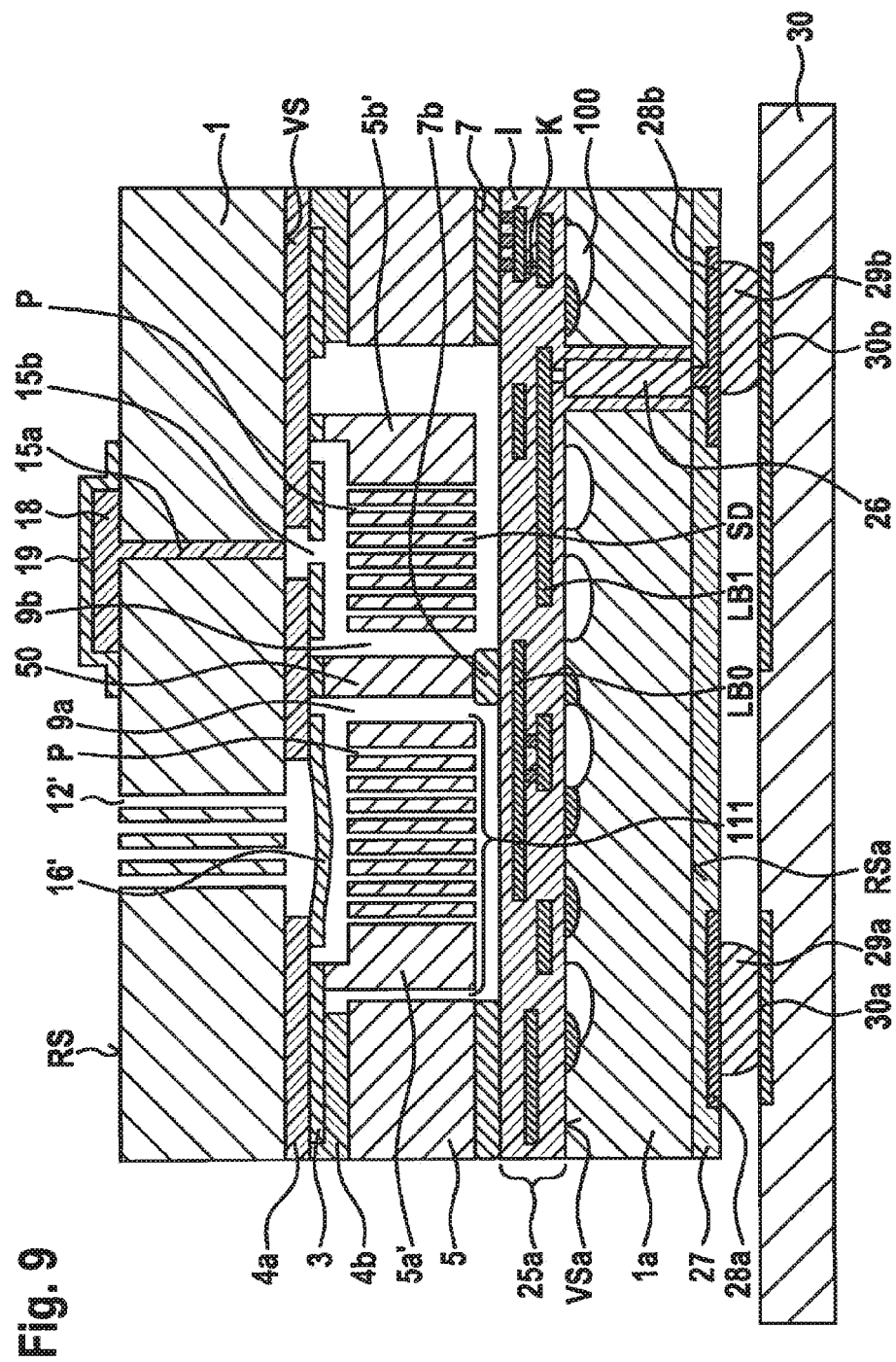
FIG. 9 shows a schematic cross-sectional view for explaining a micromechanical pressure sensor device and a corresponding manufacturing method according to an eighth second specific embodiment of the present invention.

FIG. 9 shows a schematic cross-sectional view for explaining a micromechanical pressure sensor device and a corresponding manufacturing method according to an eighth specific embodiment of the present invention.

In the eight specific embodiment, the micromechanical pressure sensor device already described is combined with a rotation rate sensor device SD which is formed in second micromechanical functional layer 5 and is anchored in first micromechanical functional layer 3 by way of an anchoring area 5b'. This type of rotation rate sensor device SD during operation may possibly require a different ambient pressure than the pressure sensor device.

Bond connection 7 includes an area 7b which connects rewiring system 25a and a separating area 50 in second micromechanical functional layer 5 in such a way that rotation rate sensor device SD is enclosed in a separate further cavity 9b which is hermetically separated from cavity 9a, which encloses second stationary pressure detection electrode 111.

To reduce the internal pressure in second cavity 9b, after the wafer bonding for establishing bond connection 7 between the MEMS system and the ASIC system, an access opening 15a through MEMS wafer 1 as well as a channel 15b through first insulating layer 4a and first micromechanical functional layer 3 may be provided by an appropriate etching process in order to pump out cavity 9b through access opening 15a and channel 15b, and, similarly to the specific embodiment described above, to subsequently close same by an oxide layer 18, optionally in combination with a metal layer 19.

Alternatively, it is also possible by way of suitable process control to set an increased internal pressure during closure of access opening 15a, for example to operate an acceleration sensor instead of the rotation rate sensor in cavity 9b. The increased internal pressure is used for damping the acceleration sensor, and prevents undesirable movements of the sensor structure due to vibration excitations.

In addition, in the sense of the configuration in FIG. 9 it is possible to provide a pressure sensor, a rotation rate sensor, and an acceleration sensor on a chip, and thus to implement a 7d element. The pressure sensor and the rotation rate sensor may be situated in a shared cavity having low internal pressure, and the acceleration sensor, separated by way of a trench area 50, may be situated in a cavity having high internal pressure. A separate illustration of this configuration is not provided here.

Figure 10:
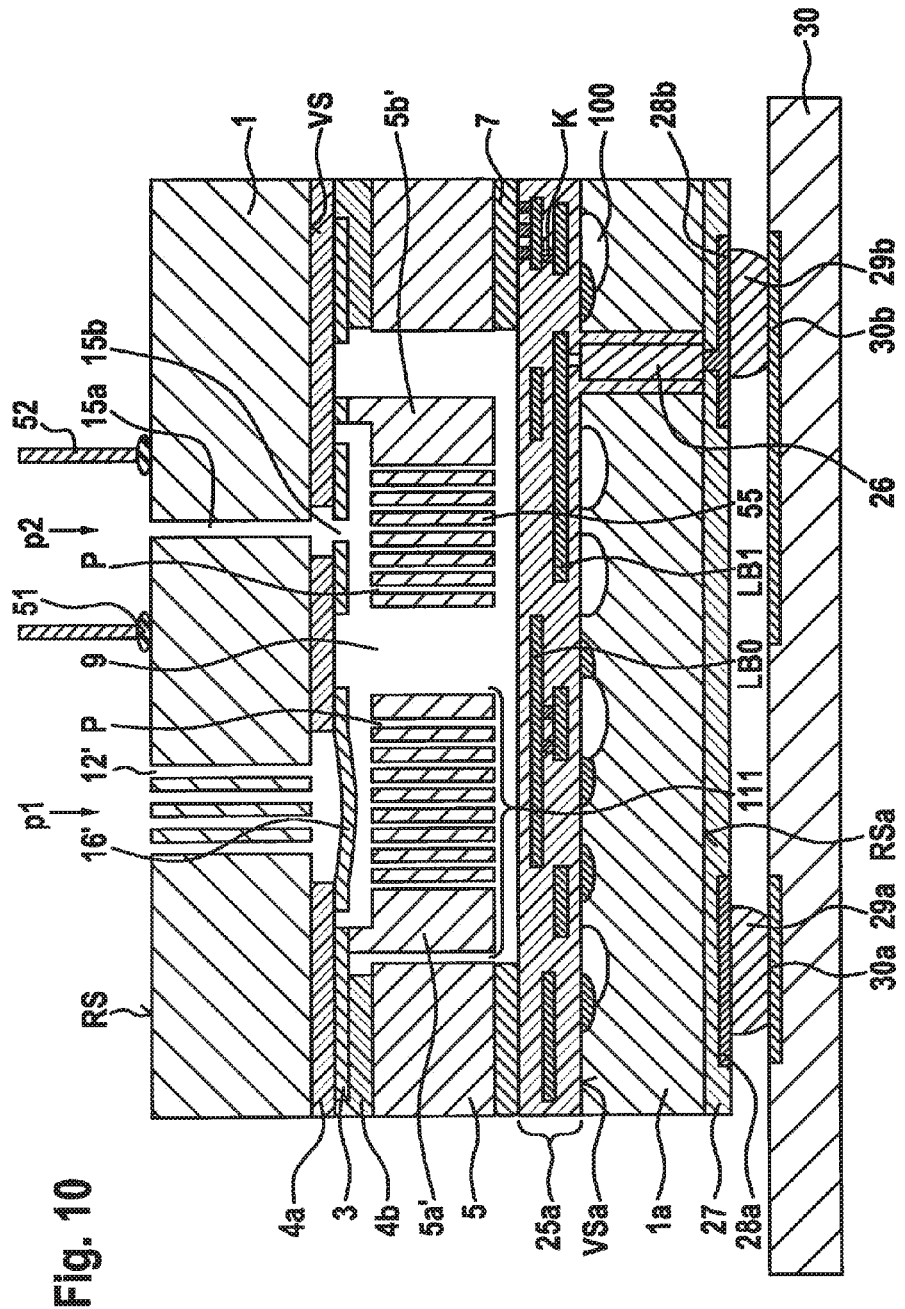
FIG. 10 shows a schematic cross-sectional view for explaining a micromechanical pressure sensor device and a corresponding manufacturing method according to a ninth specific embodiment of the present invention.

FIG. 10 shows a schematic cross-sectional view for explaining a micromechanical pressure sensor device and a corresponding manufacturing method according to a ninth specific embodiment of the present invention.

In the ninth specific embodiment illustrated in FIG. 10, MEMS wafer 1 includes a further unclosed via 15a which leads into cavity 9. Due to this further via 15a, a counterpressure p2 may be applied which opposes pressure p1, which acts through via 12'. Consequently, diaphragm area 16' will deflect according to differential pressure p2−p1. Counterpressure p2 may be applied, for example, by way of an external supply line 52, together with an appropriate seal 51, on rear side RS of MEMS wafer 1.

In this example, the area of second micromechanical functional layer 5 denoted by reference numeral 55 may have the function of an acceleration sensor whose behavior is only negligibly influenced by small pressure changes of p2.

Although the present invention has been described with reference to preferred exemplary embodiments, it is not limited thereto. In particular, the mentioned materials and topologies are solely examples, and are not limited to the described examples.

What is claimed is:

1. A micromechanical pressure sensor device, comprising:
an ASIC wafer having a front side and a rear side;
a rewiring system, formed on the front side of the ASIC wafer, which includes a plurality of stacked strip conductor levels and insulation layers;
a MEMS wafer having a front side and a rear side;
a first micromechanical functional layer which is formed above the front side of the MEMS wafer;
a second micromechanical functional layer which is formed above the first micromechanical functional layer;
a diaphragm area which may be acted on by pressure through a via in the MEMS wafer being formed as a deflectable first pressure detection electrode in one of the first and second micromechanical functional layers; and
a stationary second pressure detection electrode formed in the other of the first and second micromechanical functional layers, at a distance and opposite from the diaphragm area;
wherein the second micromechanical functional layer is connected to the rewiring system by way of a bond connection in such a way that the stationary second pressure detection electrode is enclosed in a cavity, the rewiring system capping the cavity to enclose the stationary second pressure detection electrode;
wherein the diaphragm area is formed in the first micromechanical functional layer, and the stationary second pressure detection electrode is formed in the second micromechanical functional layer; and
wherein the stationary second pressure detection electrode has at least one anchoring area, which is anchored on the first micromechanical functional layer, the second micromechanical functional layer having a contact area separated from the anchoring area, which is anchored on the first micromechanical functional layer and has an electrical connection to an uppermost strip conductor level of the stacked strip conductor levels of the rewiring system by way of an area of the bond connection, and the anchoring area of the stationary second pressure detection electrode and the contact area of the second mechanical functional layer being electrically connected to each other by way of the first micromechanical functional layer.

2. The micromechanical pressure sensor device as recited in claim 1, wherein a spring element is provided between the at least one anchoring area and the remaining portion of the stationary second pressure detection electrode.

3. The micromechanical pressure sensor device as recited in claim 1, wherein a ring-shaped anchoring area is provided.

4. A micromechanical sensor device, comprising:
an ASIC wafer having a front side and a rear side;
a rewiring system, formed on the front side of the ASIC wafer, which includes a plurality of stacked strip conductor levels and insulation layers;
a MEMS wafer having a front side and a rear side;
a first micromechanical functional layer which is formed above the front side of the MEMS wafer;
a second micromechanical functional layer which is formed above the second micromechanical functional layer;
a diaphragm area which may be acted on by pressure through a via in the MEMS wafer, the diaphragm area being formed as a deflectable first pressure detection electrode in one of the first and second micromechanical functional layers; and
a stationary second pressure detection electrode formed in the other of the first and second micromechanical functional layer, at a distance and opposite from the diaphragm area;
wherein the second micromechanical functional layer is connected to the rewiring system by way of a bond connection in such a way that the diaphragm area is enclosed in a cavity, the rewiring system capping the cavity to enclose the diaphragm area;

wherein the diaphragm area is formed in the second micromechanical functional layer, and the stationary second pressure detection electrode is formed in the first micromechanical functional layer in a perforated manner;

wherein the diaphragm area is being anchored by way of an anchoring area on the first micromechanical functional layer with a ring-shaped closure;

wherein the second micromechanical functional layer has a contact area separated from the anchoring area, which is anchored on the first micromechanical functional layer and has an electrical connection to an uppermost strip conductor level of the stacked strip conductor levels of the rewiring system by way of an area of the bond connection, and the anchoring area of the diaphragm area and the contact area of the second mechanical functional layer being electrically connected to each other by way of the first micromechanical functional layer.

5. The micromechanical pressure sensor device as recited in claim 4, wherein a stationary third pressure detection electrode is formed in the uppermost strip conductor level, at a distance and opposite from the diaphragm area.

6. The micromechanical pressure sensor device as recited in claim 1, wherein a reference diaphragm area is formed in the first micromechanical functional layer, and a stationary reference electrode is formed in the second micromechanical functional layer, at a distance and opposite from the reference diaphragm area, and where the reference diaphragm area cannot be acted on by the pressure.

7. The micromechanical pressure sensor device as recited in claim 1, wherein a further diaphragm area is formed in the first micromechanical functional layer, and a stationary reference electrode is formed in the second micromechanical functional layer, at a distance and opposite from the further diaphragm area, the further diaphragm area being designed as a deflectable moisture detection electrode which is covered with a moisture-sensitive layer which may be acted on by moisture through a further via in the MEMS wafer.

8. The micromechanical pressure sensor device as recited in claim 1, wherein a further sensor device is formed in the second micromechanical functional layer, and the bond connection includes an area that is connected to the rewiring system in such a way that the further sensor device is enclosed in a further cavity which is hermetically separated from the cavity.

9. The micromechanical pressure sensor device as recited in claim 1, wherein the diaphragm area may be acted on by counterpressure through a further via in the MEMS wafer which leads into the cavity.

10. A manufacturing method for a micromechanical pressure sensor device, comprising:

providing an ASIC wafer, having a front side and a rear side, and a rewiring system which is formed on the front side of the ASIC wafer and which includes a plurality of strip conductor levels and insulating layers situated in between;

providing a MEMS wafer, having a front side and a rear side, a first micromechanical functional layer which is formed above the front side of the MEMS wafer, and a second micromechanical functional layer which is formed above the first micromechanical functional layer, a diaphragm area which may be acted on by pressure through a via in the MEMS wafer being formed as a deflectable first pressure detection electrode in one of the first and second micromechanical functional layers, and a stationary second pressure detection electrode being formed in the other of the first and second micromechanical functional layers, at a distance and opposite from the diaphragm area; and connecting the second micromechanical functional layer to the rewiring system by way of a bond connection in such a way that the stationary second pressure detection electrode is enclosed in a cavity, the rewiring system capping the cavity to enclose the stationary second pressure detection electrode;

wherein the diaphragm area is formed in the first micromechanical functional layer, and the stationary second pressure detection electrode is formed in the second micromechanical functional layer;

wherein the stationary second pressure detection electrode having at least one anchoring area, which is anchored on the first micromechanical functional layer;

wherein the second micromechanical functional layer has a contact area separated from the anchoring area, which is anchored on the first micromechanical functional area and has an electrical connection to an uppermost strip conductor level of the stacked strip conductor levels of the rewiring system by way of an area of the bond connection; and wherein the anchoring area of the stationary second pressure detection electrode and the contact area of the second mechanical functional layer are electrically connected to each other by way of the first micromechanical functional layer.

11. A manufacturing method for a micromechanical pressure sensor device, comprising:

providing an ASIC wafer, having a front side and a rear side, and a rewiring system which is formed on the front side of the ASIC wafer and which includes a plurality of strip conductor levels and insulating layers situated in between;

providing a MEMS wafer, having a front side and a rear side, a first micromechanical functional layer which is formed above the front side of the MEMS wafer, and a second micromechanical functional layer which is formed above the first micromechanical functional layer, a diaphragm area which may be acted on by pressure through a via in the MEMS wafer being formed as a deflectable first pressure detection electrode in one of the first and second micromechanical functional layers, and a stationary second pressure detection electrode being formed in the other of the first and second micromechanical functional layers, at a distance and opposite from the diaphragm area; and connecting the second micromechanical functional layer to the rewiring system by way of a bond connection in such a way that the diaphragm area is enclosed in a cavity, the rewiring system capping the cavity to enclose the diaphragm area;

wherein the diaphragm area is formed in the second micromechanical functional layer, and the stationary second pressure detection electrode is formed in the first micromechanical functional layer in a perforated manner;

wherein the diaphragm area is anchored by way of an anchoring area on the first micromechanical functional layer with a ring-shaped closure;

wherein the second micromechanical functional layer has a contact area separated from the anchoring area, which is anchored on the first micromechanical functional area and has an electrical connection to an uppermost strip conductor level of the stacked strip conductor levels of the rewiring system by way of an area of the bond connection; and wherein the anchoring area of the diaphragm area and the contact area of the second mechanical functional layer are electrically connected to each other by way of the first micromechanical functional layer.

\* \* \* \* \*